United States Patent
Oda

(10) Patent No.: US 7,940,146 B2
(45) Date of Patent: May 10, 2011

(54) BOUNDARY ACOUSTIC WAVE ELEMENT, BOUNDARY ACOUSTIC WAVE DEVICE, AND MANUFACTURING METHODS FOR THE SAME

(75) Inventor: Tetsuya Oda, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 86 days.

(21) Appl. No.: 12/428,710

(22) Filed: Apr. 23, 2009

(65) Prior Publication Data

US 2009/0201102 A1    Aug. 13, 2009

Related U.S. Application Data

(63) Continuation of application No. PCT/JP2007/069446, filed on Oct. 4, 2007.

(30) Foreign Application Priority Data

Nov. 13, 2006    (JP) ................................ 2006-306600

(51) Int. Cl.
- *H03H 9/08* (2006.01)
- *H03H 3/02* (2006.01)
- *H03H 9/54* (2006.01)

(52) U.S. Cl. ......... 333/193; 333/195; 29/25.35; 29/594; 29/600; 310/340; 310/346

(58) Field of Classification Search .......... 333/193–196; 310/313 R, 313 B, 313 D, 340, 346; 29/25.35, 29/594, 600
See application file for complete search history.

(56) References Cited

U.S. PATENT DOCUMENTS

| | | | |
|---|---|---|---|
| 5,349,240 A | | 9/1994 | Narita et al. |
| 5,436,503 A | | 7/1995 | Kunitomo et al. |
| 5,550,408 A | | 8/1996 | Kunitomo et al. |
| 6,310,422 B1 * | 10/2001 | Satoh et al. ................ | 310/313 R |
| 6,351,194 B2 * | 2/2002 | Takahashi et al. ............ | 333/133 |
| 7,622,515 B2 * | 11/2009 | Osuga ............................ | 523/457 |
| 2001/0030795 A1 * | 10/2001 | Fujii et al. ..................... | 359/285 |
| 2003/0132517 A1 * | 7/2003 | Matsuta et al. ............... | 257/706 |
| 2004/0040740 A1 | 3/2004 | Nakatani et al. | |
| 2005/0057323 A1 | 3/2005 | Kando | |
| 2005/0264375 A1 | 12/2005 | Ikuta et al. | |
| 2005/0285700 A1 | 12/2005 | Koga et al. | |
| 2006/0138902 A1 | 6/2006 | Kando | |
| 2007/0278898 A1 * | 12/2007 | Miura et al. ............... | 310/313 R |

FOREIGN PATENT DOCUMENTS

JP        05-129474 A        5/1993

(Continued)

OTHER PUBLICATIONS

Official Communication issued in International Patent Application No. PCT/JP2007/069446, mailed on Dec. 4, 2007.

*Primary Examiner* — Barbara Summons
(74) *Attorney, Agent, or Firm* — Keating & Bennett, LLP

(57) ABSTRACT

A boundary acoustic wave element includes an IDT electrode arranged at the interface between a piezoelectric substance and a dielectric layer, a heat dissipation film is arranged on the outer side surface of the dielectric layer or on the outer side surface of a sound-absorbing film laminated on the outer side of the dielectric layer, the heat dissipation film is arranged to have a portion that overlaps the IDT electrode in plan view, and the heat dissipation film is connected to a bump provided on the outer side surface of the sound-absorbing film, and is connected to a via-hole conductor that extends through the sound-absorbing film. The boundary acoustic wave element and a boundary acoustic wave device are excellent in a heat dissipation property and hence can provide enhanced electric power resistance, without causing an increase in chip size and an increase in the area of the mounting space.

9 Claims, 10 Drawing Sheets

FOREIGN PATENT DOCUMENTS

| | | | |
|---|---|---|---|
| JP | 06-224259 A | | 8/1994 |
| JP | 2000-196407 | * | 7/2000 |
| JP | 2003-273704 A | | 9/2003 |
| JP | 2004-159262 A | | 6/2004 |
| JP | 2004-253839 A | | 9/2004 |
| JP | 2006-014096 A | | 1/2006 |
| JP | 2006-147726 A | | 6/2006 |
| WO | 2007/055080 A1 | | 5/2007 |

* cited by examiner

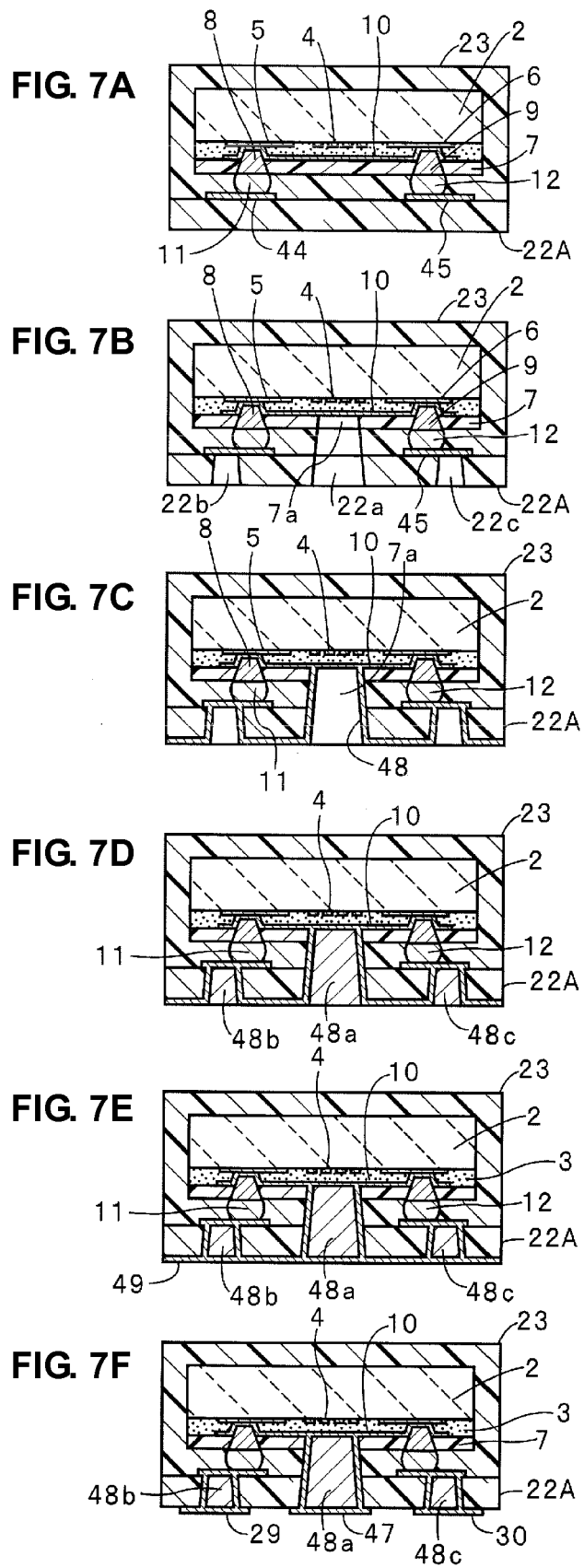

BOUNDARY ACOUSTIC WAVE ELEMENT, BOUNDARY ACOUSTIC WAVE DEVICE, AND MANUFACTURING METHODS FOR THE SAME

BACKGROUND OF THE INVENTION

1. Field of the Invention

The present invention relates to a boundary acoustic wave element and a boundary acoustic wave device which are used in resonators and band-pass filters, for example, and manufacturing methods for the same. More specifically, the present invention relates to a boundary acoustic wave element and a boundary acoustic wave device which are provided with a heat dissipation structure, and manufacturing methods for the same.

2. Description of the Related Art

Recently, surface acoustic wave filter devices are widely used as band-pass filters in the RF stage of mobile telephones. High electric power resistance is significantly demanded for this type of band-pass filters.

Accordingly, Japanese Unexamined Patent Application Publication No. 2006-14096 proposes a structure which quickly releases heat generated when large electric power is applied to an IDT electrode, thereby suppressing migration of the IDT electrode and enhancing electric power resistance.

In a surface acoustic wave device described in Japanese Unexamined Patent Application Publication No. 2006-14096, a surface acoustic wave element is mounted on the upper surface of a circuit board, and the periphery of the surface acoustic wave element is sealed with molding resin. In the above-mentioned surface acoustic wave element, a functional electrode portion including the IDT electrode is formed on one principal surface of a piezoelectric substrate. A grounding annular electrode is formed so as to surround this functional electrode portion.

The above-mentioned surface acoustic wave element is mounted on the upper surface of the circuit board in such a way that its one principal surface side where the above-mentioned functional electrode portion and the grounding annular electrode are formed is opposed to the upper surface of the circuit board. The grounding annular electrode is electrically connected to a through-conductor provided so as to extend through the circuit board from the upper surface to the lower surface, and the through-conductor is electrically connected to a grounding conductor provided on the lower surface of the circuit board.

In this structure, the grounding annular electrode is electrically connected to a portion of the functional electrode portion including the IDT electrode which is connected to the ground potential. Therefore, heat generated in the IDT electrode is readily released to the exterior through the grounding annular electrode, the through-conductor, and the grounding conductor. Thus, an adverse influence due to heat is suppressed, making it possible to enhance electric power resistance.

Recently, on the other hand, boundary acoustic wave devices are attracting attention instead of surface acoustic wave devices. In surface acoustic wave devices, a space for vibrations of a portion where the IDT electrode is arranged must be provided within the package. In contrast, such a space can be omitted in the boundary acoustic wave devices. Thus, the boundary acoustic wave devices are small-sized.

FIG. 11 is a schematic front sectional view showing an example of a boundary acoustic wave device according to the related art.

A boundary acoustic wave element 501 has a piezoelectric substance 502. An IDT electrode 504, and reflectors 505 and 506 are formed on the upper surface of the piezoelectric substance 502. A dielectric substance 503 is laminated on the upper surface of the piezoelectric substance 502. That is, a functional electrode portion including the IDT electrode 504 is disposed at the interface between the piezoelectric substance 502 and the dielectric substance 503. A sound-absorbing layer 507 is provided on the dielectric substance 503. The sound-absorbing layer 507 is provided to absorb bulk waves that have propagated to the upper surface side of the dielectric substance 503, and suppresses unwanted spurious response.

In the case of the boundary acoustic wave element 501 as well, heat is generated in the functional electrode portion including the IDT electrode 504 when in actual use. Thus, there is a fear that migration of the IDT electrode or the like may occur due to this heat, causing electric power resistance to be decreased.

Therefore, it is considered desirable that the boundary acoustic wave element 501 also be provided with a heat dissipation structure such as one described in Japanese Unexamined Patent Application Publication No. 2006-14096.

However, in the case where the heat dissipation structure described in Japanese Unexamined Patent Application Publication No. 2006-14096 is adopted for the boundary acoustic wave element 1, the boundary acoustic wave element becomes large. Thus, the advantage of the boundary acoustic wave element, namely that it allows miniaturization, is greatly impaired. That is, in the heat dissipation structure described in Japanese Unexamined Patent Application Publication No. 2006-14096, the grounding annular electrode is arranged to surround the functional electrode portion including the IDT electrode. Accordingly, to provide a grounding annular electrode in the boundary acoustic wave element 501, naturally, on the upper surface of the piezoelectric substance 2, the grounding annular electrode must be formed in the peripheral region including the functional electrode portion such as the IDT electrode 504. Thus, the area of the above-mentioned boundary interface becomes large, that is, the plan area of the boundary acoustic wave element 501 becomes large, leading to an inevitable increase in mounting space.

In a case where the above-mentioned grounding annular electrode is provided in the boundary acoustic wave element 501, it is necessary to provide a connecting conductor for leading out the grounding annular electrode to the lower surface of the piezoelectric substance 502, or to the outer side surfaces of the dielectric substance 503 and sound-absorbing layer 507, which adds complexity to the structure of the boundary acoustic wave element 501 and also leads to high manufacturing cost.

SUMMARY OF THE INVENTION

Preferred embodiments of the present invention overcome the problems of the related art, and provide a boundary acoustic wave element equipped with a structure that makes it possible to quickly dissipate heat generated in an IDT electrode to enhance electric power resistance without enlarging a mounting space or mounting structure, and also provide a boundary acoustic wave device using the boundary acoustic wave element, and manufacturing methods for the same.

A boundary acoustic wave element according to a preferred embodiment of the present invention relates to a boundary acoustic wave element including a piezoelectric substance, a dielectric substance laminated on the piezoelectric substance, an IDT electrode disposed at an interface between the piezoelectric substance and the dielectric substance, and a sound-absorbing film provided on a surface of the dielectric substance opposite to the interface, the boundary acoustic wave element using a boundary acoustic wave that propagates along a boundary between the piezoelectric substance and the dielectric substance, characterized in that the boundary acoustic wave element further includes a heat dissipation pattern which is provided on an external surface of the dielectric substance or the sound-absorbing film and which has a portion that overlaps the IDT electrode in a plan view, the boundary acoustic wave element preferably further includes a bump provided on an outer side surface of the sound-absorbing film, and a via-hole conductor that extends through the sound-absorbing film and is electrically connected to the IDT electrode and the bump, and the bump and the heat dissipation pattern are connected to each other by the via-hole conductor. Preferably, the heat dissipation pattern is made of a metal or an alloy with a thermal conductivity of about 20 W/(m·K) or more, thereby making it possible to quickly dissipate heat generated in the IDT electrode.

Although the above-mentioned metal is not particularly limited, preferably, a metal selected from the group consisting of Al, Cu, Ni, and Cr, or an alloy mainly including the metal is used, for example. In that case, since these kinds of metal or alloy are superior in thermal conductivity, heat can be quickly dissipated.

In the boundary acoustic wave element according to a preferred embodiment of the present invention, a substantially center portion of the heat dissipation pattern is preferably connected to the via-hole conductor. In this case, since the portion of the heat dissipation pattern which is connected to the via-hole conductor is substantially the center portion of the heat dissipation pattern, the distance between the via-hole conductor and the farthest portion of the heat dissipation pattern becomes small, and heat is thus quickly dissipated. In this case, more preferably, a cross-sectional area of the via-hole conductor is set equal to or greater than a cross-sectional area of the IDT electrode. Thus, heat is quickly dissipated through the via-hole conductor.

A boundary acoustic wave device according to a preferred embodiment of the present invention includes the boundary acoustic wave element configured in accordance with another preferred embodiment of the present invention, a mounting substrate on which the boundary acoustic wave element is mounted, and a sealing resin that seals the boundary acoustic wave element mounted on the mounting substrate, and is characterized in that a thermal conductivity of the sealing resin is equal to or higher than about 0.8 W/(m·K).

A manufacturing method for a boundary acoustic wave element according to a preferred embodiment of the present invention includes the steps of: forming an IDT electrode on a mother piezoelectric substance; forming a dielectric layer to cover the IDT electrode; forming a sound-absorbing film on the heat dissipation pattern, on an upper surface of the dielectric layer; forming the heat dissipation pattern, which is shaped to have a portion that overlaps the IDT electrode in plan view, on the dielectric layer or the sound-absorbing film; forming an opening that extends through the sound-absorbing film; and cutting the mother piezoelectric substance into discrete boundary acoustic wave elements.

A manufacturing method for a boundary acoustic wave device according to a preferred embodiment of the present invention includes the steps of: preparing an assembly plate; forming a land arranged to mount a boundary acoustic wave element, on an upper surface of the assembly plate; mounting a plurality of the boundary acoustic wave elements by flip-chip bonding, so that the bump is joined to the land on the assembly plate; sealing the plurality of boundary acoustic wave elements mounted on the assembly plate with a sealing resin to form a plurality of resin-sealed members; detaching the resin-sealed members from the assembly plate; forming an opening in the resin-sealed members so as to expose a portion of the heat dissipation pattern; preparing a mounting substrate having in a mounting region an opening of substantially the same size as the opening in the resin-sealed members; joining the resin-sealed members onto the mounting substrate so that the opening in the resin-sealed members coincides with the opening in the mounting substrate coincides; and filling a conductive paste in the opening in the resin-sealed members and in the opening in the mounting substrate.

In a manufacturing method for a boundary acoustic wave device according to a preferred embodiment of the present invention, in the step of forming an opening in the resin-sealed members to expose a portion of the heat dissipation pattern, the opening is preferably formed so that a central portion of the heat dissipation pattern is exposed, and the opening in the mounting substrate is provided at a central portion of the mounting region. In this case, since a conductor formed by filling a conductive paste in the openings in the resin-sealed members and the mounting substrate is joined to the central portion of the heat dissipation pattern, heat can be dissipated more quickly.

In the boundary acoustic wave element according to a preferred embodiment of the present invention, in the laminate structure of the piezoelectric substance, the IDT electrode, the dielectric substance, and the sound-absorbing film, the heat dissipation pattern is provided on the outer side surface of the dielectric substance or the sound-absorbing film, the heat dissipation pattern has a portion that overlaps the IDT electrode in plan view, and the heat dissipation pattern is electrically connected to the bump by the via-hole conductor. Therefore, when heat generated in the IDT electrode is transmitted to the heat dissipation pattern, the heat can be quickly released to the bump through the via-hole conductor.

Thus, not only is heat released by the above-mentioned route passing through the IDT electrode, the via-hole conductor, and the bump, but heat is also released by a route passing through the heat dissipation pattern, the via-hole conductor, and the bump. Accordingly, the heat dissipation property is enhanced, thereby making it possible to enhance electric power resistance.

Moreover, the via-hole conductor and the bump provided on the above-mentioned sound-absorbing film are indispensable components for establishing electrical connection with the IDT electrode and the like, and since heat generated in the above-mentioned dissipation pattern can be released by using the via-hole conductor and the bumps that are such indispensable components, it is possible to enhance the heat dissipation property without causing an increase in chip size.

Thus, the structure of the boundary acoustic wave element is unlikely to become complex, and it is possible to provide a small-sized boundary acoustic wave element having an excellent heat dissipation property, without causing a significant increase in the cost of the boundary acoustic wave element.

In the boundary acoustic wave device according to a preferred embodiment of the present invention, the boundary acoustic wave element according to a preferred embodiment of the present invention is mounted on the mounting substrate, a sealing resin that seals the boundary acoustic wave element mounted on the mounting substrate is provided, and the thermal conductivity of the sealing resin is set to about 0.8 W/(m·K) or more. Thus, heat generated in the boundary acoustic wave element is quickly dissipated to the above-mentioned bump. At this time, the heat is quickly dissipated to the outer surface of the boundary acoustic wave device through the sealing resin in the periphery of the bump. Therefore, it is possible to provide a boundary acoustic wave device having an excellent heat dissipation property and excellent electric power resistance.

In a manufacturing method for a boundary acoustic wave element according to a preferred embodiment of the present invention, when forming an IDT electrode on a mother piezoelectric substance, forming a dielectric layer, and forming a sound-absorbing film on an upper surface of the dielectric layer, the boundary acoustic wave element according to a preferred embodiment of the present invention can be obtained simply by forming the heat dissipation pattern on the dielectric layer or on the sound-absorbing film, and cutting the mother dielectric substance member into discrete boundary acoustic wave elements. Therefore, it is possible to provide the boundary acoustic wave element according to a preferred embodiment of the present invention that is excellent in a heat dissipation property in a stable manner, without going through complicated steps.

In the manufacturing method for a boundary acoustic wave device according to a preferred embodiment of the present invention, the boundary acoustic wave device according to a preferred embodiment of the present invention can be obtained simply by forming a land on the assembly plate, mounting the boundary acoustic wave device by flip-chip bonding, sealing the boundary acoustic wave element with a sealing resin to form a resin-sealed member, detaching the resin-sealed member from the assembly plate, forming an opening in the resin-sealed member to expose a portion of the heat dissipation pattern, joining the resin-sealed member onto the mounting substrate so that the opening in the resin-sealed member is located at the opening in the mounting substrate, and filling a conductive paste in the openings of both the resin-sealed member and the mounting substrate. Therefore, it is possible to provide the boundary acoustic wave device having an excellent heat dissipation property in a stable manner, without causing an increase in chip size.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 7A to 7F are front sectional views showing another example of manufacturing method for a boundary acoustic wave device according to the third preferred embodiment of the present invention.

DETAILED DESCRIPTION OF THE PREFERRED EMBODIMENTS

Hereinbelow, specific preferred embodiments of the present invention will be described with reference to the drawings to clarify the present invention.

Figure 1:
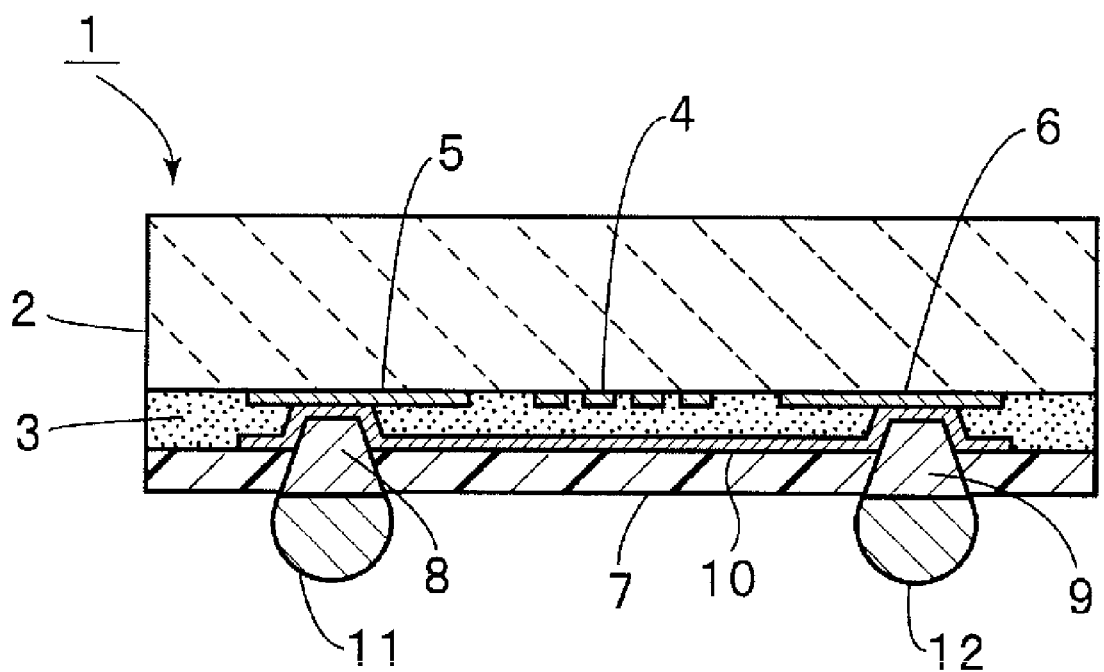
FIG. 1 is a front sectional view of a boundary acoustic wave element according to a first preferred embodiment of the present invention.

FIG. 1 is a schematic front sectional view showing a boundary acoustic wave element according to a first preferred embodiment of the present invention.

A boundary acoustic wave element 1 has a piezoelectric substrate 2 as a piezoelectric substance. The piezoelectric substrate 2 is made of a piezoelectric single crystal such as $LiNbO_3$, for example. However, the piezoelectric substrate 2 may be made of a piezoelectric material other than a piezoelectric single crystal.

A dielectric layer 3 is provided on one principal surface of the piezoelectric substrate 2. The dielectric layer 3 is made of $SiO_2$ in this preferred embodiment. Electrode pads 5 and 6 are arranged at the interface between the piezoelectric substrate 2 and the dielectric layer 3. The IDT electrode 4 defines a functional electrode portion at the time when a boundary acoustic wave element is driven. A functional electrode portion indicates an electrode that functions to provide desired characteristics at the time when a boundary acoustic wave element is exited, and broadly includes an electrode portion that functions as a reflector, a capacitance, an inductance, or a resistor, other than the IDT electrode. The electrode pads 5 and 6 are electrically connected to a portion of the functional electrode portion which is connected to the ground potential.

The IDT electrode 4 and the electrode pads 5 and 6 are preferably formed by patterning a film made of a suitable metal or alloy on one principal surface of the piezoelectric substrate 2. In the boundary acoustic wave element 1, by exciting the IDT electrode 4, boundary acoustic waves are excited, and electrical characteristics using the boundary acoustic waves are extracted. The boundary acoustic waves propagate along the interface between the piezoelectric substrate 2 and the dielectric layer 3.

On the other hand, a sound-absorbing film 7 is laminated on the outer side surface of the dielectric layer 3. The sound-absorbing film 7 is made of a suitable material in which the sound velocities of longitudinal and transverse waves are lower than the sound velocities of longitudinal and transverse waves in the dielectric layer 3. Although not particularly limited, synthetic resin such as polyimide or epoxy resin, for example, can be suitably used as such a material. In this preferred embodiment, the sound-absorbing film 7 is preferably made of polyimide, for example.

Since the sound velocities of longitudinal and transverse waves in the sound-absorbing film 7 are lower than the sound velocities of longitudinal and transverse waves in the dielectric layer 3, in the sound-absorbing film 7, modes that become spurious response which have been propagated from the dielectric layer 3 side are attenuated, thereby making it possible to minimize a reflection of the modes that will be a spurious response toward the boundary between the piezoelectric substrate 2 and the dielectric layer 3. That is, by the sound-absorbing characteristics, undesired spurious responses are suppressed.

Via-hole conductors 8 and 9 are arranged to extend through the dielectric layer 3 and the sound-absorbing film 7. The via-hole conductors 8 and 9 can be made of a suitable metal such as solder, for example.

The via-hole conductors 8 and 9 are electrically connected to the electrode pads 5 and 6.

One of the unique features of this preferred embodiment is a heat dissipation pattern 10 on the outer surface of the dielectric layer 3. The heat dissipation pattern 10 is arranged on the outer surface of the dielectric layer 3, and is electrically connected to the via-hole conductors 8 and 9. The heat dissipation pattern 10 is made of a material including a metal or an alloy, for example, which has an excellent heat dissipation property. Al, Cu, or Ni, or an alloy of these is suitably used as such a material, for example, and examples of such an alloy include AlCu and NiCr, for example. These kinds of metal or alloy have high thermal conductivities of 20 W/m·K or more, and are thus excellent in a heat dissipation property as will be described later.

As seen in plan view of the boundary acoustic wave element 1, the heat dissipation pattern 10 partially overlaps the IDT electrode 4. That is, the heat dissipation pattern 10 is disposed below the functional electrode portion including the IDT electrode 4 of the boundary acoustic wave element 10.

While the grounding annular electrode described in Japanese Unexamined Patent Application Publication No. 2006-14096 described above is arranged to surround the functional electrode portion, the heat dissipation pattern 10 according to this preferred embodiment is provided at a position overlapping the functional electrode portion. Therefore, the heat dissipation pattern 10 can be formed without increasing the plan area of the boundary acoustic wave element 1. This makes it possible to enhance the heat dissipation property without causing an increase in the size of the boundary acoustic wave element 1, that is, without causing an increase in mounting space. The via-hole conductors 8 and 9 are electrically connected to bumps 11 and 12. That is, the bumps 11 and 12 are arranged on the via-hole conductors 8 and 9.

As mentioned above, the heat dissipation pattern 10 is preferably made of a material having excellent thermal conductivity, and is connected to the via-hole conductors 8 and 9. Upon exiting the boundary acoustic wave element 1, heat is generated in the IDT electrode 4. This heat is transmitted to the electrode pads 5 and 6 electrically connected to a portion of the functional electrode portion including the IDT electrode 4 which is connected to the ground potential. Since the via-hole conductors 8 and 9 are connected to the electrode pads 5 and 6, this heat is released toward the bumps 11 and 12 through the via-hole conductors 8 and 9.

Moreover, since the heat dissipation pattern 10 is arranged immediately below the IDT electrode 4, when heat generated in the IDT electrode 4 is transmitted to the heat dissipation pattern 10 through the dielectric layer 3, this heat is released to the bumps 11 and 12 through the via-hole conductors 8 and 9 from the heat dissipation pattern 10.

Therefore, heat generated in the IDT electrode 4 can be quickly dissipated through the above-mentioned two routes. This makes it possible to suppress migration and enhance electric power resistance.

Next, a description will be given of preferred embodiments of a manufacturing method for the boundary acoustic wave element 1, and a manufacturing method for a boundary acoustic wave device using the boundary acoustic wave element 1 and its structure.

In the manufacturing method for the boundary acoustic wave element 1, first, a piezoelectric substrate is prepared, and the IDT electrode 4 and the electrode pads 5 and 6 are formed by photolithography or the like on the mother piezoelectric substrate. Thereafter, the dielectric layer 3 is formed by depositing a $SiO_2$ film on one principal surface of the piezoelectric substrate 2 that is a mother substrate. Next, a plurality of through-holes is formed on the dielectric layer 3 so that the electrode pads 5 and 6 are exposed. Thereafter, the heat dissipation pattern 10 is formed on the outer surface of the dielectric layer 3 by photolithography. Then, after forming the heat dissipation pattern 10, the sound-absorbing film 7 is formed by applying polyimide by spin coating or the like, for example.

Next, openings are formed in portions where the via-hole conductors 8 and 9 are to be formed by photolithography and etching. Then, the openings are plated with Ni and Au, for example, and a plated film as an under-bump metal layer is formed on the electrode pads 5 and 6 and the surface of the heat dissipation pattern 10 which is exposed through the openings. Thereafter, a conductive paste is filled in the openings, forming the via-hole conductors 8 and 9. The conductive paste consists of a suitable conductive paste such as a solder paste, for example. The via-hole conductors 8 and 9 are formed by the conductive paste to be dried and cured.

Thereafter, a conductive paste such as a solder paste is further applied onto the via-hole conductors 8 and 9, forming the bumps 11 and 12. Next, a structure in which a plurality of boundary acoustic wave elements obtained in the above-mentioned manner are put together on the mother piezoelectric substrate is cut into discrete boundary acoustic wave elements, thereby obtaining the boundary acoustic wave element 1 shown in FIG. 1.

Figure 2A:
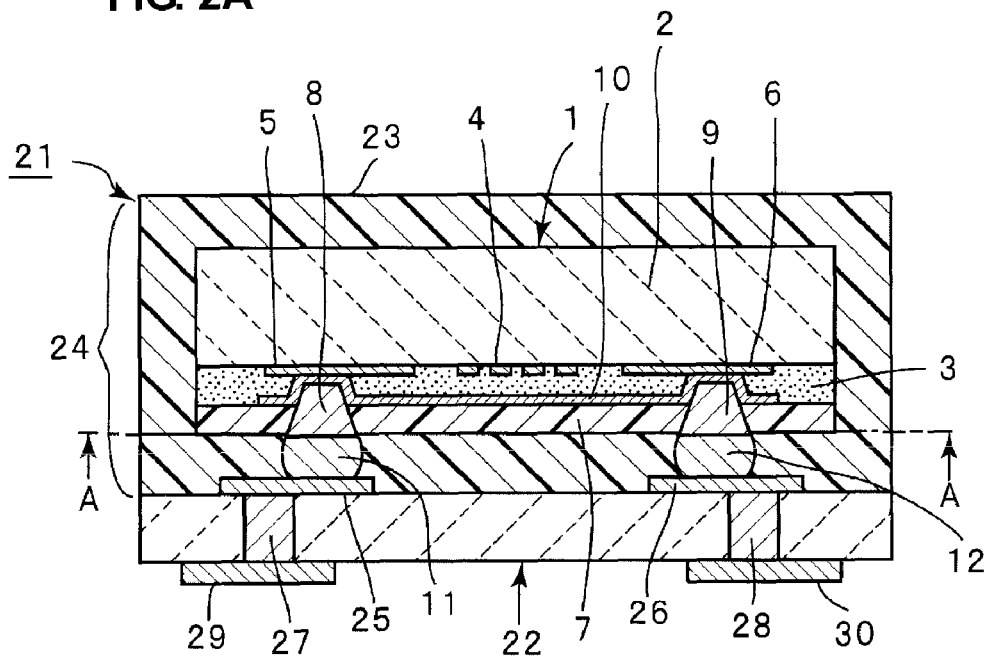
FIGS. 2A and 2B are respectively a front sectional view of a boundary acoustic wave device according to the first preferred embodiment, and a sectional view taken along the line A-A in FIG. 2A.

In this preferred embodiment, a boundary acoustic wave device 21 shown in FIG. 2A is manufactured by using the boundary acoustic wave element 1 obtained as mentioned above.

In the boundary acoustic wave device 21, the boundary acoustic wave element 1 is mounted on a mounting substrate 22, and is sealed with a sealing resin 23.

In the manufacturing process, first, an assembly plate is prepared. Although not particularly limited, a plate-shaped member made of a hard material having excellent dimensional stability such as metal is preferably used as the assembly plate. A land arranged to mount the boundary acoustic wave element 1 is formed on the upper surface of this assembly plate. This land is located in correspondence to electrode lands provided on the mounting substrate 22. Then, the boundary acoustic wave element 1 is mounted by flip-chip bonding so as to be joined to the land on the assembly plate.

Thereafter, a plurality of the boundary acoustic wave elements 1 mounted on the assembly plate are sealed with the sealing resin 23. In this manner, a large number of resin-sealed members 24 are formed on the assembly plate from the boundary acoustic wave element 1 and the sealing resin 23 shown in FIG. 2A. The resin material forming the above-mentioned sealing resin 23 is not particularly limited as long as the material has an insulating property. As such a resin material, for example, a thermosetting resin composition including epoxy resin and a curing agent is preferably used.

Preferably, since an inorganic filler is superior in thermal conductivity to synthetic resin, it is desirable that an inorganic filler be contained in the above-mentioned thermosetting resin composition. As such an inorganic filler, carbon, silica, tungsten, or the like is preferably used, for example. When an inorganic filler is contained, it is possible to control the flowability in the thermosetting process performed by heating, and enhance the strength and dimensional stability of a cured product obtained after the curing. In addition, since the inorganic filler is excellent in thermal conductivity, the heat dissipation effect can be enhanced. That is, heat generated in the IDT electrode 4 can be dissipated to the exterior also from the sealing resin 23, thereby making it possible to further enhance a heat dissipation property.

Therefore, more preferably, it is desirable that the sealing resin 23 be formed by a thermosetting resin composition containing the above-mentioned inorganic filler, which is superior in thermal conductivity to synthetic resin, as much as possible, and it is desirable that the content of the inorganic filler be set high at, for example, about 80 weight percent or more, for example.

After a plurality of the resin-sealed members 24 are formed on the assembly plate as mentioned above, the resin-sealed members 24 are detached from the assembly plate. Thereafter, the resin-sealed members 24 are mounted on the mounting substrate 22 shown in FIG. 2A preferably by flip-chip bonding. The mounting substrate 22 has electrode lands 25 and 26 formed on its upper surface. The bumps 11 and 12 are joined to the electrode lands 25 and 26.

The mounting substrate 22 is provided with via-hole conductors 27 and 28. The via-hole conductors 27 and 28 extend through the mounting substrate 22, and are connected to the electrode lands 25 and 26 at their upper ends. The lower ends of the via-hole conductors 27 and 28 are joined to terminal electrodes 29 and 30. The terminal electrodes 29 and 39 are formed on the lower surface of the mounting substrate 22.

Therefore, the boundary acoustic wave device 21 can be handled as a small electronic chip component in which the boundary acoustic wave element 1 is resin-sealed.

Figure 2B:
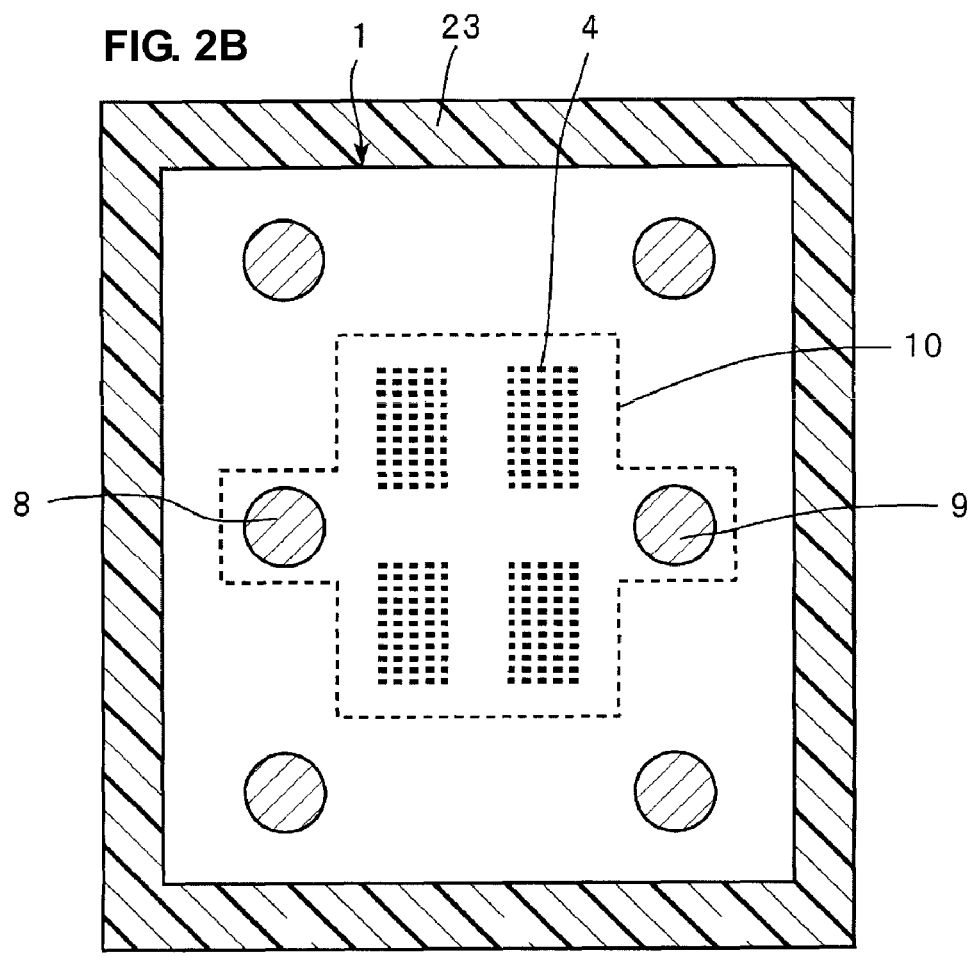

FIG. 2B is a schematic sectional view of the portion taken along the arrow A-A line in FIG. 2A. In this drawing, the positional relationship between the heat dissipation pattern 10 and the IDT electrode 4 located above the heat dissipation pattern 10 is schematically shown. That is, the heat dissipation pattern 10 is located directly below the IDT electrode 4, and is provided in a region overlapping the IDT electrode 4. Therefore, it can be seen that heat radiated downwards from the IDT electrode 4 is quickly released from the heat dissipation pattern 10.

Figure 3:
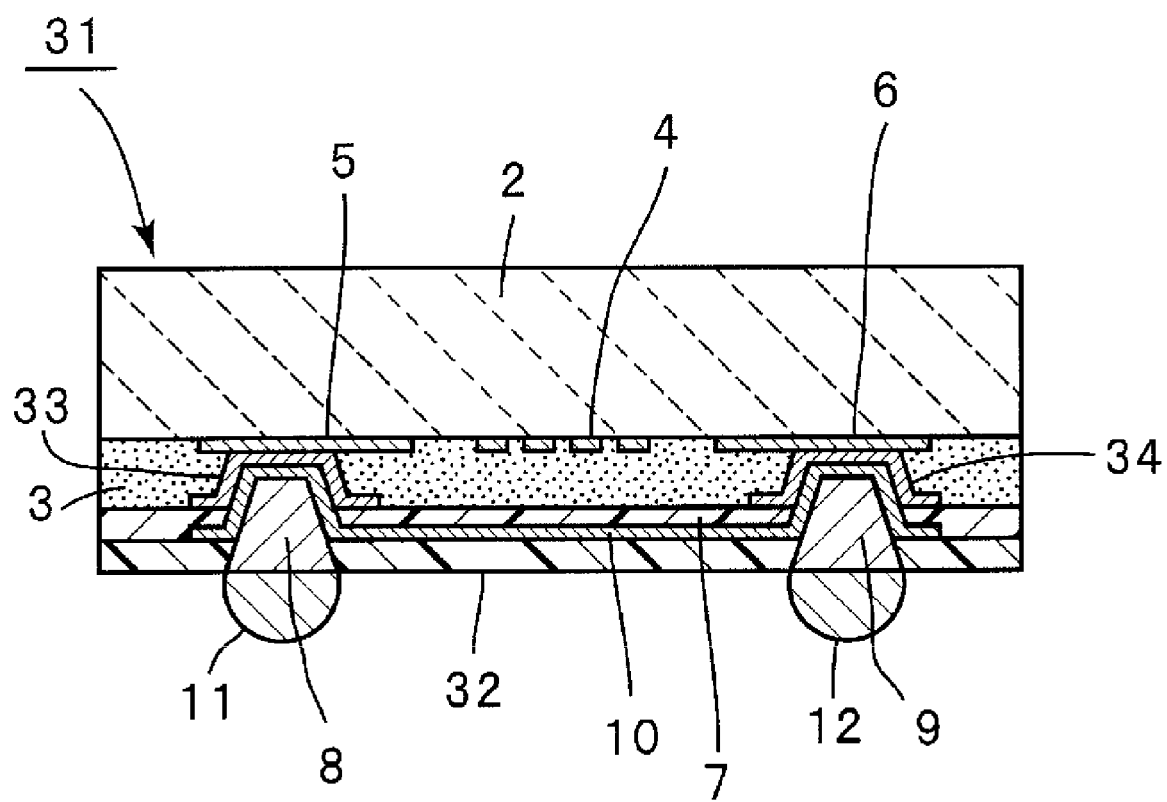
FIG. 3 is a front sectional view of a boundary acoustic wave element according to a second preferred embodiment of the present invention.

FIG. 3 is a front sectional view showing a boundary acoustic wave element according to a second preferred embodiment of the present invention. In a boundary acoustic wave element 31 according to the second preferred embodiment, the heat dissipation pattern 10 is not provided on the outer surface of the dielectric layer 3. Instead, the heat dissipation pattern 10 is provided on the outer side surface of the sound-absorbing film 7 that is provided on the outside of the dielectric layer 3, and an insulating layer 32 is further provided on the outer side of the heat dissipation pattern 10. Then, to electrically connect the electrode pads 5 and 6 and the via-hole conductors 8 and 9 to each other, electrode films 33 and 34 are formed within through-holes formed in the dielectric layer 3. A portion of the heat dissipation pattern 10 is laminated on the electrode films 33 and 34, and the via-hole conductors 8 and 9 are formed thereon. Otherwise, the boundary acoustic wave element 31 preferably has the same structure as the boundary acoustic wave element 1.

The above-mentioned insulating layer 32 is made of a suitable insulating material, and is formed by spin-coated synthetic resin such as polyimide, for example, in this preferred embodiment. The heat dissipation pattern 10 can be protected by providing the insulating layer 32 as described above. The insulating layer 32 may also be used as a solder resist when forming the via-hole conductors 8 and 9 and the bumps 11 and 12. That is, an insulating layer may be formed as a solder resist to be used for forming the via-hole conductors 8 and 9 and the bumps 11 and 12, and the insulating layer may be kept to be the insulating layer 32.

In the boundary acoustic wave element 31 according to this preferred embodiment as well, not only is the heat generated in the IDT electrode 4 be dissipated to the external from the electrode pads 5 and 6 through the electrode films 33 and 34 by the route of the via-hole conductors 8 and 9 and then the bumps 11 and 12, but since the heat dissipation pattern 10 is located directly below the IDT electrode 4, that is, to overlap the IDT electrode 4, and the heat dissipation pattern 10 is connected to the via-hole conductors 8 and 9, heat that has been transmitted to the heat dissipation pattern 10 from the IDT electrode 4 through the dielectric layer 3 is also quickly dissipated.

Therefore, according to the second preferred embodiment as well, a heat dissipation property can be enhanced, which in turn makes it possible to enhance electric power resistance.

Figure 4A:
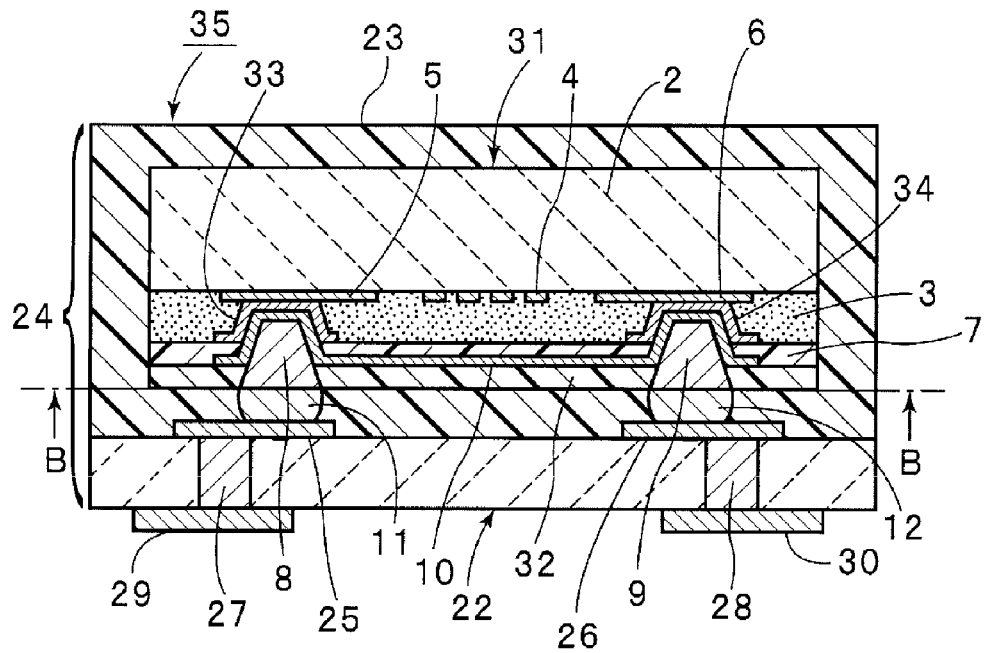
FIGS. 4A and 4B are respectively a front sectional view of a boundary acoustic wave device according to the second preferred embodiment, and a sectional view taken along the line B-B in FIG. 4A.
Figure 4B:
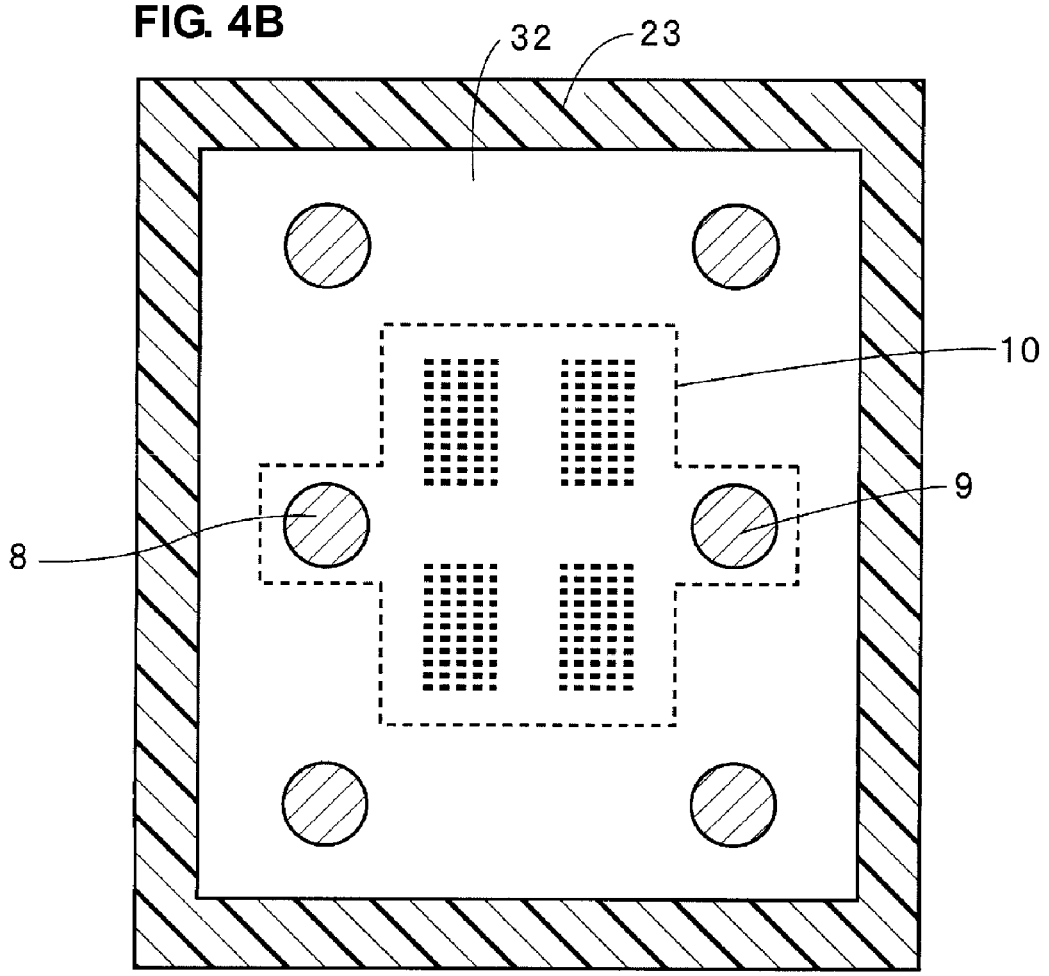

FIGS. 4A and 4B are schematic front sectional views of a boundary acoustic wave device 35 using the boundary acoustic wave element 31 according to the second preferred embodiment. That is, as in the boundary acoustic wave device 21 shown in FIG. 2, by sealing the boundary acoustic wave element 31 with the sealing resin 24 on the mounting substrate 22, the boundary acoustic wave device 35 having excellent environmental resistance characteristics and a small chip size can be provided. FIG. 4B is a schematic plan sectional view taken along the line B-B in FIG. 4A. As is clear from FIG. 4B, in this preferred embodiment as well, the heat dissipation pattern 10 is located in a region overlapping the IDT electrode 4.

Figure 5A:
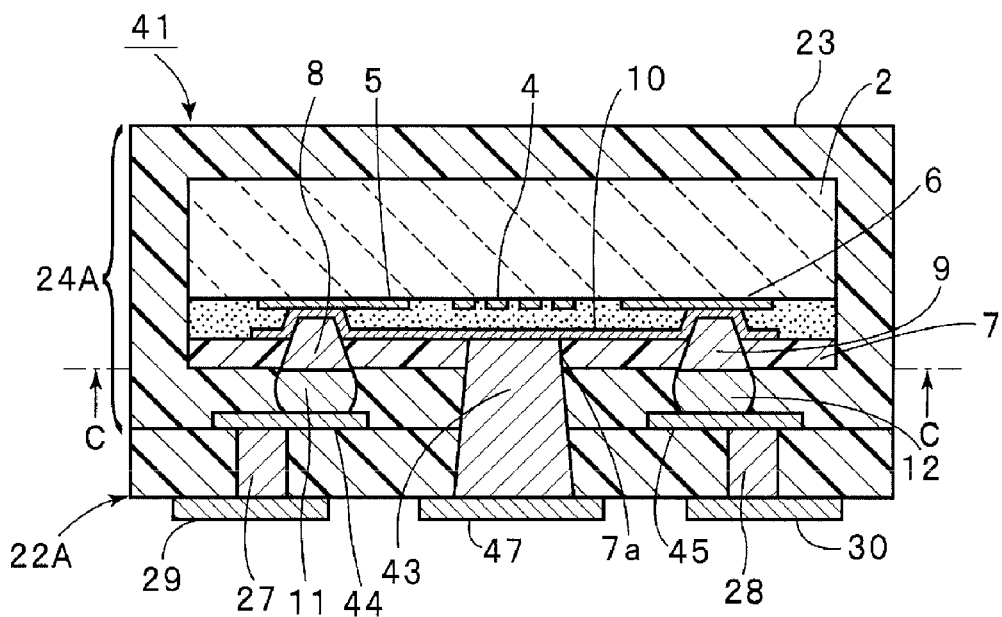
FIGS. 5A and 5B are respectively a front sectional view of a boundary acoustic wave device according to a third preferred embodiment, and a sectional view taken along the line C-C in FIG. 5A.
Figure 5B:
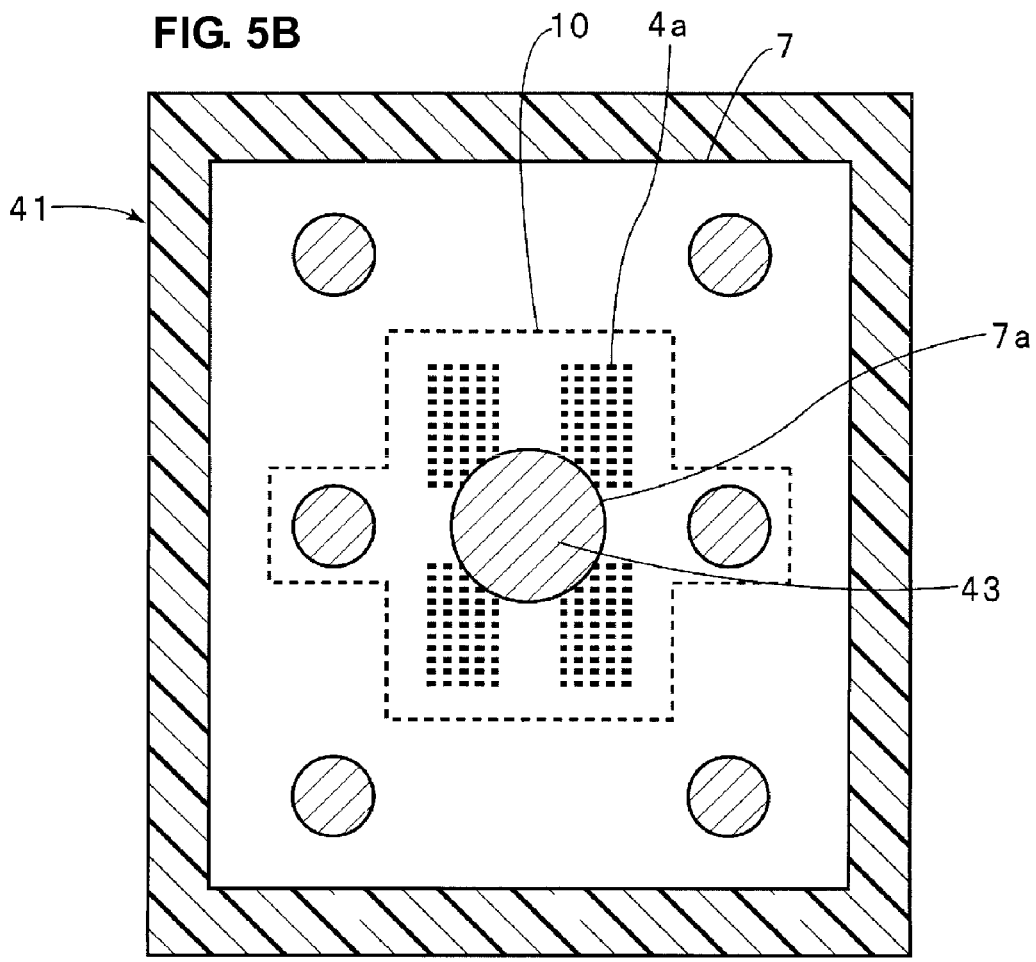

Next, referring to FIGS. 5A and 5B, the structure of and manufacturing method for a boundary acoustic wave device according to a third preferred embodiment of the present invention will be described.

In the third preferred embodiment, the boundary acoustic wave element 41 is prepared in the same manner as in the first preferred embodiment. Next, as shown in FIG. 5A, an opening 7a is defined in the sound-absorbing film 7 made of polyimide, below the heat dissipation pattern 10. The opening 7a is arranged directly below the IDT electrode 4. That is, as shown in the sectional view of FIG. 5B taken along the line C-C in FIG. 5A, the large opening 7a is substantially located at the central portion of the heat dissipation pattern 10.

The opening 7a can be formed by photolithography. It is desirable that the opening 7a have a size greater than the area of a single IDT electrode 4a. Thus, as will be described later, heat can be quickly released from the heat dissipation pattern 10 by a via-hole electrode described later which is formed in the opening 7a.

Next, the boundary acoustic wave element 1 is mounted on an unillustrated assembly plate made of metal. Lands made of Cu or the like are arranged on the surface of this assembly plate in advance, and the bumps 11 and 12 of the boundary acoustic wave element 1 are joined onto the lands.

Thereafter, the periphery of the boundary acoustic wave element 1 is sealed with the sealing resin 23, forming a resin-sealed member 24A. Next, the resin-sealed member 24A is stripped from the above-mentioned assembly plate. In this case, the electrode lands and the like on the assembly plate are transferred to the resin-sealed member 24A side. In this manner, a conductor made of Cu provided on the above-mentioned assembly plate is transferred to the resin-sealed member 24A side as a portion of the via-hole conductor 43, and electrode lands 44 and 45 are also transferred.

Thereafter, the resin-sealed member 24A may be mounted on a mounting substrate 22A. The mounting substrate 22A is of the same structure as the mounting substrate 22 shown in FIG. 2A, except that the electrode lands 25 and 26 are not provided since the electrode lands 44 and 45 are arranged on the resin-sealed member 24A side in advance, and that a conductor made of Cu is filled in the relatively large opening arranged to define the via-hole conductor 43. Therefore, the resin-sealed member 24A is mounted to the mounting substrate 24A in such a way that the opening 7a of the above-mentioned resin-sealed member 24A coincides with the relatively large opening that is provided at the center of the mounting region of the mounting substrate 24A and has the conductor made of Cu filled therein. Thus, the conductor portion made of Cu within the opening 7a, and the conductor portion made of Cu within the opening of the mounting substrate 22A are joined together, defining the via-hole conductor 43. In this manner, the boundary acoustic wave device 41 according to this preferred embodiment can be obtained.

In this preferred embodiment, since the above-mentioned via-hole conductor 43 is joined to substantially the center of the heat dissipation pattern 10, heat is quickly transmitted to the via-hole conductor 43 from various regions of the heat dissipation pattern 10. Therefore, the heat dissipation property can be further enhanced.

The formation of the opening arranged to define the via-hole conductor 43 can be done by various methods. These methods will be described with reference to FIGS. 6A to 7F.

Figure 6A:
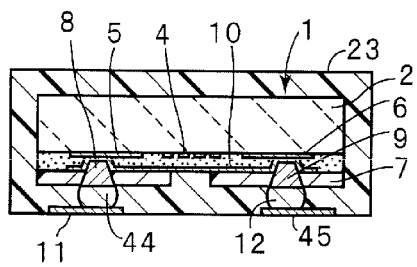
FIGS. 6A to 6F are front sectional views showing an example of manufacturing method for a boundary acoustic wave device according to the third preferred embodiment of the present invention.
Figure 6B:
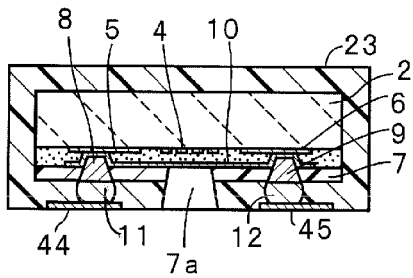

In a method shown in FIGS. 6A to 6F, the periphery of the boundary acoustic wave element 1 is coated with a sealing resin 51. Thereafter, the electrode lands 44 and 45 are formed on the lower surface of the sealing resin 51. Next, as shown in FIG. 6B, the opening 7a is formed. The formation of the opening 7a can be performed by a suitable method such as a method using a laser device such as a carbon dioxide gas laser or an excimer laser, or etching, for example.

Figure 6C:
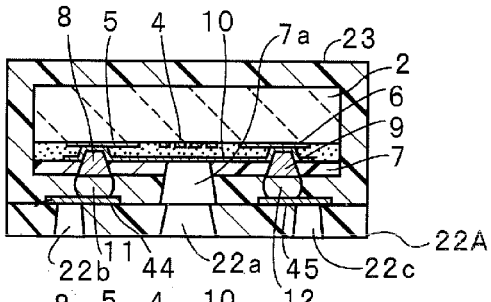

Next, the mounting substrate 22A shown in FIG. 6C made of a resin sheet which defines a mounting substrate is bonded. The mounting substrate 22A has an opening 22a that is continuous to the opening 7a, and openings 22b and 22c smaller than the opening 22a. The openings 22b and 22c are provided at positions that overlap the electrode lands 44 and 45.

Although a sheet made of a suitable synthetic resin material can be used as the resin sheet for forming the above-mentioned mounting substrate 22A, preferably, a resin sheet made of a thermosetting resin composition is preferably used. As such a thermosetting resin sheet, an epoxy resin-based resin composition is preferably used, and more preferably, a thermosetting resin composition containing the above-described inorganic filler having excellent thermal conductivity is used.

Figure 6D:
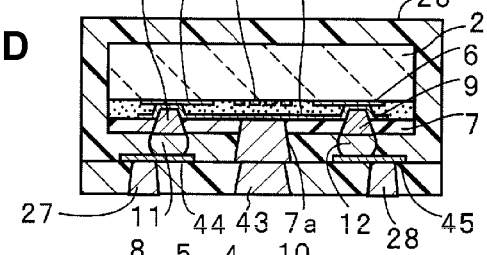
Figure 6E:
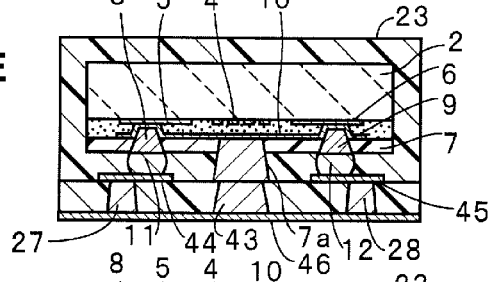
Figure 6F:
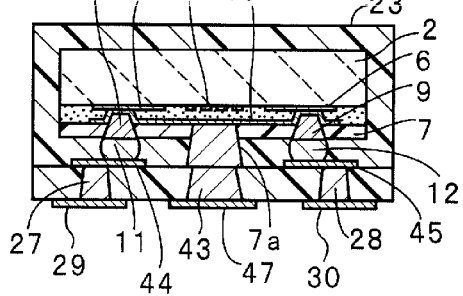

Next, as shown in FIG. 6D, a conductive paste is filled in the openings 22a and 22c by screen printing or the like from the lower surface side of the mounting substrate 22A.

Thereafter, a metal foil 46 made of a Cu foil or the like is bonded onto the entire lower surface of the mounting substrate 22A. Thereafter, the mounting substrate 22A and the filled conductive paste are heated for curing. In this manner, the metal foil 46 is electrically and mechanically joined to the heat dissipation pattern 10 via via-hole electrodes made of a cured conductive paste.

Next, patterning is performed on the metal foil 46 by photolithography and etching, forming terminal electrodes 29, 30, and 47. The terminal electrodes 29, 30, and 47 are electrically connected to the via-hole electrodes 27 and 28, and the via-hole electrode 43, respectively.

Normally, the steps from FIGS. 6A to 6F are performed in the mother substrate state. The mother substrate may be cut into discrete boundary acoustic wave elements by using a dicer or the like at the end, for example.

As a second method, as shown in FIG. 7A, after stripping the above-described assembly plate from the resin-sealed member, the assembly plate is bonded to the mounting substrate 22A made of a resin sheet. Next, the opening 22a though which the wiring pattern 10 is exposed, and the openings 22b and 22c through which the electrode lands 44 and 45 are exposed are formed in the lower surface of the mounting substrate 22A (see FIG. 7B).

When forming the opening 22a, the opening 22a is drilled so as to become continuous to the opening 7a formed in the sound-absorbing film 7 above, thereby exposing the heat dissipation pattern 10.

Next, as shown in FIG. 7C, a conductive film 48 made of a Cu-plated film is formed by wet plating, for example, from the lower surface side of the laminated member so as to reach the inner surfaces of the above-mentioned openings 22a to 22c. Thereafter, as shown in FIG. 7D, after forming the conductive film 48, synthetic resin pastes 48a to 48c are filled in the openings 22a to 22c. Instead of the synthetic resin pastes 48a to 48c, insulating pastes made of other insulating materials may be used. However, preferably, it is desirable that a conductive paste with a high thermal conductivity be filled in the opening 22a at the center instead of the resin paste 48a.

Next, the above-mentioned resin pastes 48a to 48c are cured by heating. Thereafter, as shown in FIG. 7E, a conductive film 49 preferably made of a Cu-plated film is formed on the lower surface of the laminated member, that is, on the entire lower surface of the mounting substrate 22A. Next, patterning is applied to the conductive film 49 by photolithography or the like, forming the terminal electrodes 29, 30, and 47. By repeating the above resin-sheet laminating step and terminal electrode forming method, a plurality of wiring layers may be formed via two or more insulating layers made of a resin sheet.

In the second method as well, the steps from FIGS. 7A to 7F may be performed in the mother substrate state, and the mother substrate may be cut into discrete boundary acoustic wave elements by using a dicer at the end.

The synthetic resin material forming the resin sheet used in the first and second methods mentioned above is preferably the same resin material as that of the sealing resin of the boundary acoustic wave device. In that case, the thermal expansion coefficient of the resin sheet and the thermal expansion coefficient of the sealing resin become the same, making it possible to suppress distortion, peeling, and the like due to temperature variations. Further, if the materials are the same, the adhesion between the two materials increases, and intrusion of moisture or the like is less likely to occur.

Figure 8A:
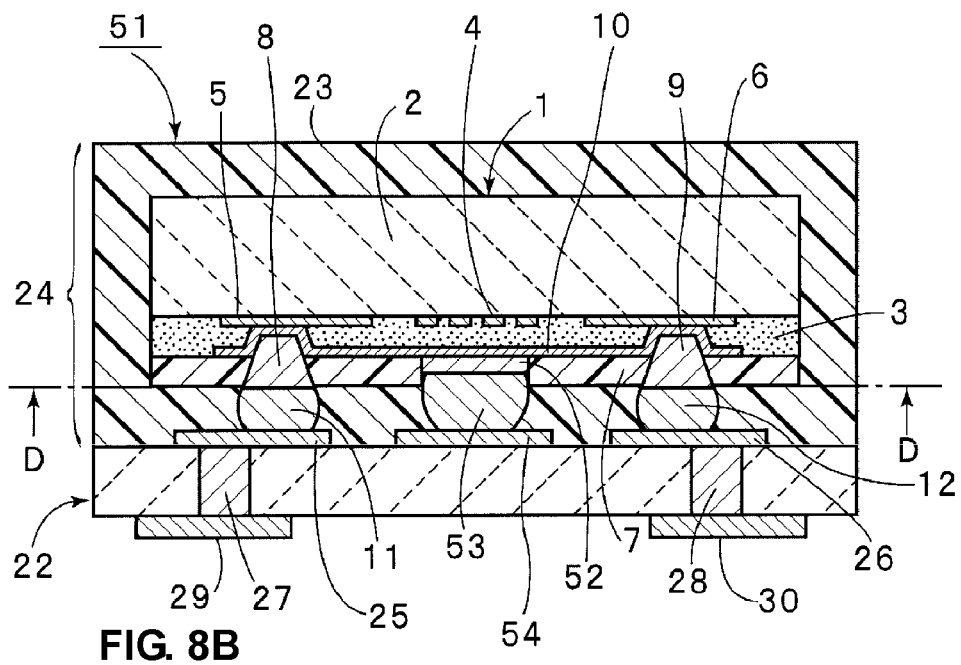
FIGS. 8A and 8B are respectively a front sectional view of a boundary acoustic wave device according to a fourth preferred embodiment, and a sectional view taken along the line D-D in FIG. 8A.
Figure 8B:
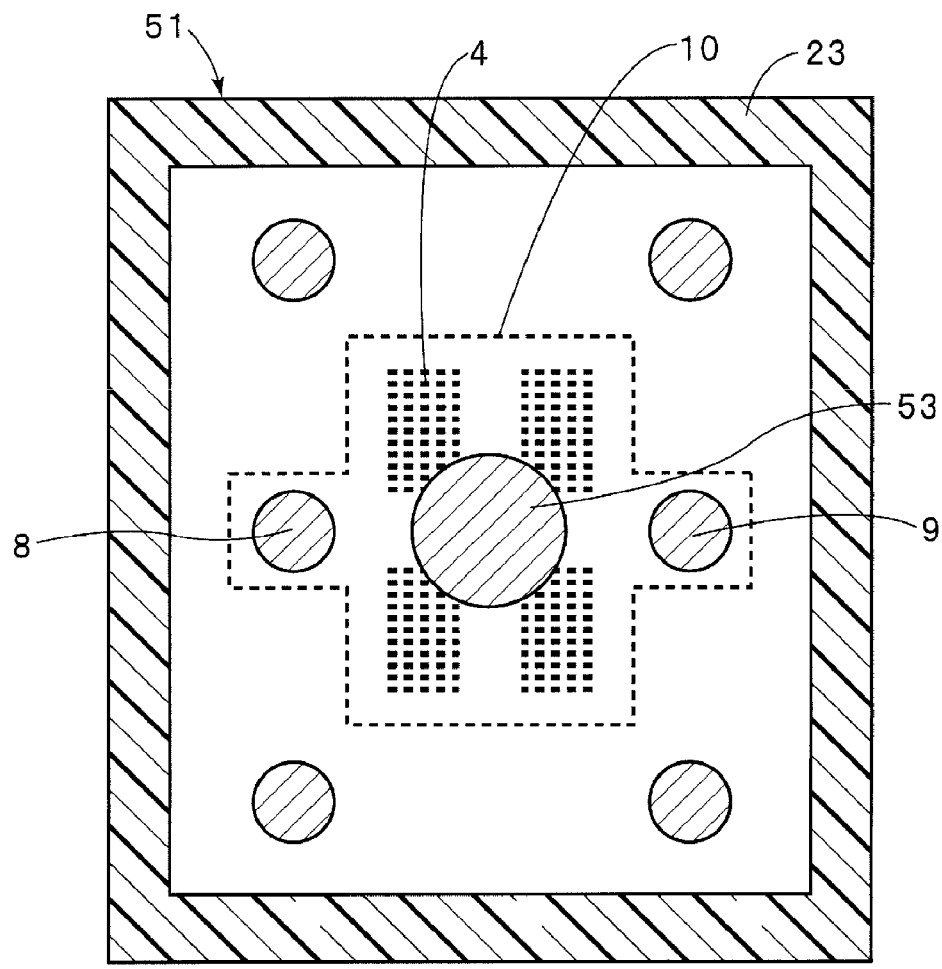

FIGS. 8A and 8B are respectively a schematic front sectional view of a boundary acoustic wave device according to a fourth preferred embodiment, and a sectional view taken along the line D-D in FIG. 8A.

In a boundary acoustic wave device 51 according to the fourth preferred embodiment, an under-bump metal layer 52 is provided at the center of the lower surface of the heat dissipation pattern 10. The under-bump metal layer 52 is made of a laminated metal film formed by plating Ni and Au to thicknesses of about 3 μm or more and about 0.05 μm or more, respectively, for example. Such an under-bump metal layer 52 is formed in advance, and a solder paste is applied onto the under-bump metal layer 52, forming a bump 53. On the other hand, an electrode land 54 to which the bump 53 is to be joined is formed on the upper surface of the mounting substrate 22, and the bump 53 is joined to the electrode land 54. Otherwise, the boundary acoustic wave device 51 preferably has the same structure as the boundary acoustic wave device 21.

In this preferred embodiment as well, the heat dissipation pattern 10 is located below the IDT electrode 4, and heat generated in the IDT electrode 4 is also dissipated by a route passing through the heat dissipation pattern 10. In particular, since the bump 53 is provided on the lower surface of the heat dissipation pattern 10 through the under-bump metal layer 52, and the bump 53 is joined to the electrode land 54 on the mounting substrate 22, heat from the heat dissipation pattern 10 is also released by a route passing through the bump 53. Therefore, the boundary acoustic wave device 51 having an even more superior heat dissipation property and, therefore, superior electric power resistance, can be provided.

The material forming the bump 53 is not limited to a solder paste, and other kinds of conductive paste may be used, for example.

In this preferred embodiment, as shown in FIG. 8B, the position at which the bump 53 is formed is substantially the center of the heat dissipation pattern 10, which also helps to quickly release heat from the heat dissipation pattern 10 to the bump 53.

Figure 9:
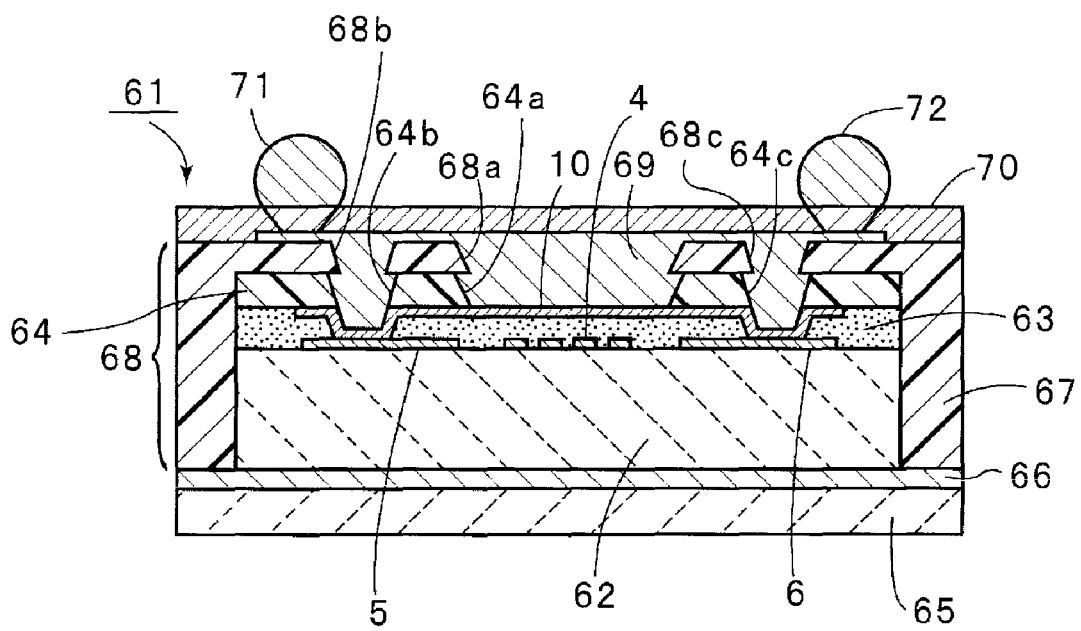
FIG. 9 is a front sectional view of a boundary acoustic wave device according to a fifth preferred embodiment of the present invention.

FIG. 9 is a front sectional view showing a boundary acoustic wave device according to a fifth preferred embodiment. In a boundary acoustic wave device 61, the IDT electrode 4 and the electrode pads 5 and 6 are arranged on the upper surface of a piezoelectric substrate 62 defining a piezoelectric substance. The piezoelectric substrate 62 is made of the same material as that of the piezoelectric substrate shown in FIG. 1.

A dielectric layer 63 preferably made of $SiO_2$ is laminated on the piezoelectric substrate 62 so as to cover the IDT electrode 4. The heat dissipation pattern 10 is laminated on the upper surface of the dielectric layer 63. Openings for exposing the electrode pads 5 and 6 are defined in the dielectric layer 63, and the heat dissipation pattern 10 reaches inside the openings as well. The heat dissipation pattern 10 is electrically connected to the electrode pads 5 and 6. On the other hand, a sound-absorbing film 64 is laminated on the dielectric layer 63. The sound-absorbing film 64 is made of the same material as that of the sound-absorbing film 7 according to the first preferred embodiment. In this preferred embodiment, the sound-absorbing film 64 is preferably made of polyimide, for example.

In the sound-absorbing film 64, a relatively large opening 64a is formed at the center. The sound-absorbing film 10 below is exposed by the opening 64a. On the other hand, through-holes 64b and 64c, which are continuous to the openings provided in the dielectric layer 63 described above, are provided separately from the opening 64a.

The piezoelectric substrate 62 is bonded to a base plate 65 through an adhesive layer 66. The base plate 65 is made of suitable synthetic resin, metal, or ceramic. Then, the piezoelectric substrate 62 is joined to the base plate 65, and resin-sealing is performed with a sealing resin 67 to cover a structure in which the IDT electrode 4, the electrode pads 5 and 6, the dielectric layer 63, and the sound-absorbing film 64 are formed, thus obtaining a resin-sealed member 68. In the resin-sealed member 68, openings 68a to 68c are arranged in the upper surface side. The opening 68a is provided at a position overlapping the opening 64a to expose the heat dissipation pattern 10 below. The openings 68b and 68c are provided at positions overlapping the through-holes 64b and 64c described above. The formation of such openings 64a to 64c can be performed by any suitable method such as a machining method using laser, or etching, for example.

Thereafter, a conductive paste is filled in the openings 68a to 68c, and cured. In this manner, a metal conductor 69 is formed. A protective film 70 made of an insulating material is formed on the entire surface of the metal conductor 69. Next, a plurality of openings is defined in the protective layer 70, and bumps 71 and 72 connected to the metal conductor 69 below are formed. In this manner, the boundary acoustic wave device 61 is obtained.

In the boundary acoustic wave device 61 according to this preferred embodiment, the heat dissipation pattern 10 is provided at a position overlapping the IDT electrode 4, and heat generated in the IDT electrode 4 is dissipated by a route passing through the heat dissipation pattern 10. In particular, since the metal conductor 69 is provided so as to contact the IDT electrode 4, heat generated in the IDT electrode 4 is more quickly transmitted to the bumps 71 and 72, and the heat dissipation property can be effectively enhanced.

In this preferred embodiment, no via-hole electrode is arranged at a position vertically overlapping the region where the IDT electrode 4 is arranged. Therefore, since the location of bumps does not affect the location of the IDT electrode 4, it is possible to increase the freedom of location of bumps in the boundary acoustic wave device, and also increase the freedom of design of the IDT electrode 4.

The material forming the protective film 70 is not particularly limited, and a suitable insulating material such as polyimide can be used, for example. Also, in the above-described preferred embodiments, the conductive material defining the electrodes and bumps is not particularly limited, and various kinds of metal or alloy can be used.

Figure 10:
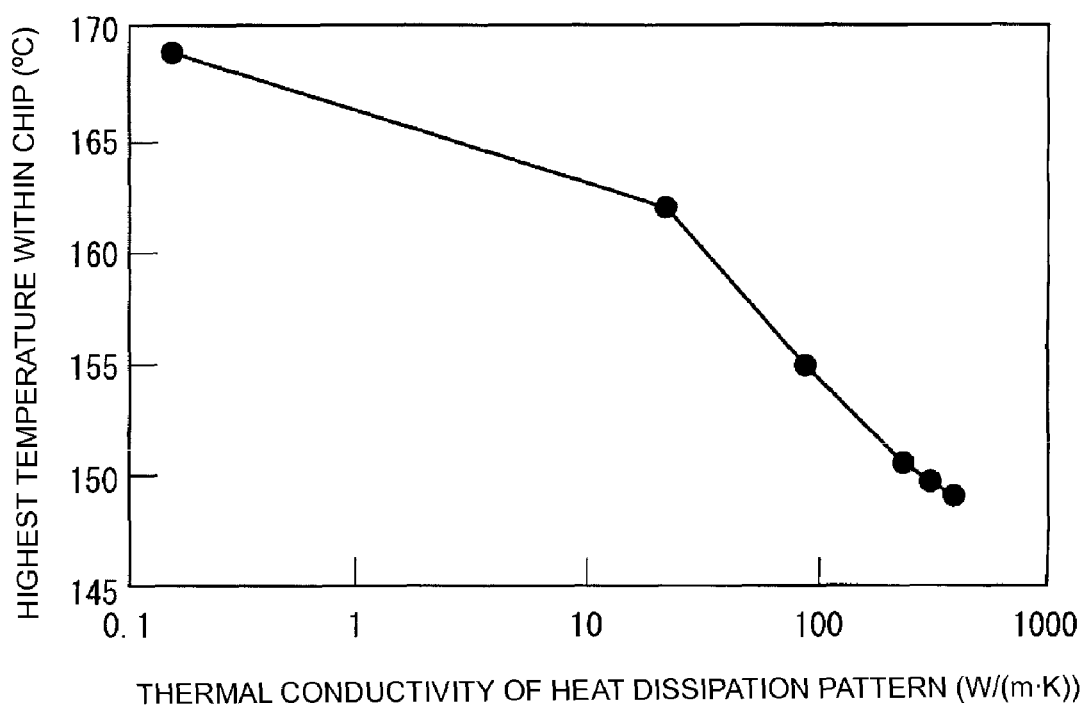
FIG. 10 is a diagram showing variations in the highest temperature within a chip in a case where the thermal conductivity of a heat dissipation film is varied in the boundary acoustic wave device according to the first preferred embodiment of the present invention.
Figure 11:
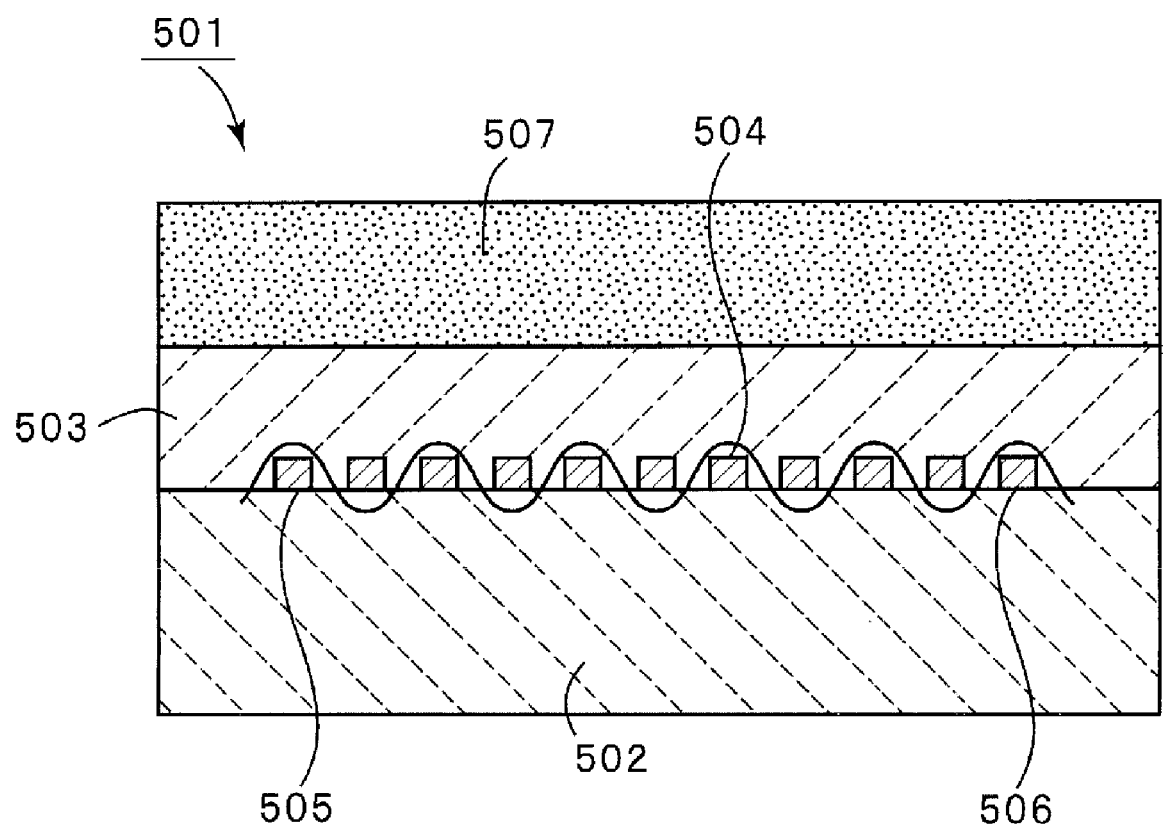
FIG. 11 is a front sectional view showing an example of a boundary acoustic wave device according to the related art.

Next, the material defining the heat dissipation pattern 10 in the boundary acoustic wave device 21 shown in FIG. 2 was changed, and the thermal conductivity of the heat dissipation pattern 10 was varied, and variations in the highest temperature within the boundary acoustic wave device 21 at the time of actual use were obtained. The results are shown in FIG. 10. The individual materials defining the boundary acoustic wave device 21 and their thermal conductivities were set as follows.

Piezoelectric substrate 2: $LiNbO_3$ with a thickness of 150 μm, and thermal conductivity is 2.93 (W/(m·K))

IDT electrode 4: made of Au, 1 μm in thickness, and thermal conductivity=315 (W/(m·K))

Dielectric layer 3: $SiO_2$, 6 μm in thickness, and thermal conductivity=1.18 (W/(m·K))

Sound-absorbing film 7: 6 μm in thickness, made of polyimide, and thermal conductivity=0.15 (W/(m·K))

Sealing Resin 23: A high thermal conductivity resin material of 40 μm in thickness with a thermal conductivity of 0.9 (W/(m·K)) including silica as an inorganic filler mixed in epoxy resin Mounting substrate 22: a glass epoxy substrate, 1000 μm in thickness, and thermal conductivity=0.3 (W/(m·K))

Diameter of via-hole conductors=40 μm, thermal conductivity is 3 to 5 (W/(m·K))

Solder bumps 11 and 12: 40 μm in projection height, and thermal conductivity=40 (W/(m·K))

The heat dissipation film 10 was set to a thickness of about 5 μm, was defined by the various kinds of metal or alloy mentioned below, and its thermal conductivity was varied. The heating value of the IDT electrode 4 was set to about 0.1 W, and the ambient temperature was set to about 25° C., for example. The plan shape of the boundary acoustic wave element 1 was set approximately to a 1.8×0.8 mm rectangle, and the plan shape of the bumps 11 and 12 was set approximately to a square whose one side is about 100 μm in length. The results are shown in FIG. 10.

As is clear from FIG. 10, it can be seen that the higher the thermal conductivity of the heat dissipation pattern 10, the lower the highest temperature within the chip. In particular, it can be seen that if the thermal conductivity of the material defining the heat dissipation film 10 is about 20 W/(m·K)) or higher, the temperature within the chip can be made sufficiently low.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave element comprising:
   a piezoelectric substance;
   a dielectric substance laminated on the piezoelectric substance;
   an IDT electrode disposed at an interface between the piezoelectric substance and the dielectric substance;
   a sound-absorbing film provided on a surface of the dielectric substance opposite to the interface;
   a heat dissipation pattern that is arranged on an outer side surface of the dielectric substance or the sound-absorbing film and includes a portion that completely overlaps an entire area of the IDT electrode when seen in a plan view;
   a bump provided on an outer side surface of the sound-absorbing film; and
   a via-hole conductor that extends through the sound-absorbing film, and is electrically connected to the IDT electrode and the bump; wherein
   the bump and the heat dissipation pattern are connected to each other by the via-hole conductor; and
   the boundary acoustic wave element using a boundary acoustic wave that propagates along a boundary between the piezoelectric substance and the dielectric substance.

2. The boundary acoustic wave element according to claim 1, wherein the heat dissipation pattern is made of a metal or an alloy having a thermal conductivity of about 20 W/(m·K) or more.

3. The boundary acoustic wave element according to claim 2, wherein the metal is made of a metal selected from the group of Al, Cu, Ni, Cr, or an alloy mainly including the metal.

4. The boundary acoustic wave element according to claim 1, further comprising:
   another via-hole conductor that extends through an approximate center portion of the sound-absorbing film; wherein
   an approximate center portion of the heat dissipation pattern is connected to the another via-hole conductor.

5. The boundary acoustic wave element according to claim 4, wherein a cross-sectional area of the another via-hole conductor is equal to or greater than a cross-sectional area of the IDT electrode.

6. A boundary acoustic wave device comprising:
   the boundary acoustic wave element according to claim 1;
   a mounting substrate on which the boundary acoustic wave element is mounted; and
   a sealing resin arranged to seal the boundary acoustic wave element mounted on the mounting substrate; wherein
   a thermal conductivity of the sealing resin is equal to or higher than about 0.8 W(m·K).

7. A manufacturing method for a boundary acoustic wave device, comprising the steps of:
   preparing an assembly plate;
   forming a land arranged to mount a boundary acoustic wave element, on an upper surface of the assembly plate;
   mounting a plurality of the boundary acoustic wave elements according to claim 1 by flip-chip bonding, so that the bump is joined to the land on the assembly plate;
   sealing the plurality of boundary acoustic wave elements mounted on the assembly plate with a sealing resin to form a plurality of resin-sealed members;
   detaching the resin-sealed members from the assembly plate;
   forming an opening in the resin-sealed members to expose a portion of the heat dissipation pattern;
   preparing a mounting substrate having in a mounting region an opening of substantially the same size as the opening in the resin-sealed members;
   joining the resin-sealed members onto the mounting substrate so that the opening in the resin-sealed members coincides with the opening in the mounting substrate; and
   filling a conductive paste in the opening in the resin-sealed members and in the opening in the mounting substrate.

8. The manufacturing method for a boundary acoustic wave device according to claim 7, wherein:
   in the step of forming an opening in the resin-sealed members to expose a portion of the heat dissipation pattern, the opening is formed so that a central portion of the heat dissipation pattern is exposed; and
   the opening in the mounting substrate is provided at a central portion of the mounting region.

9. A manufacturing method for a boundary acoustic wave element, comprising the steps of:
   forming an IDT electrode on a mother piezoelectric substance;
   forming a dielectric layer to cover the IDT electrode;
   forming a sound-absorbing film abutting a heat dissipation pattern, on an upper surface of the dielectric layer;
   forming the heat dissipation pattern, which is shaped to include a portion that completely overlaps an entire area of the IDT electrode in plan view, on the dielectric layer or the sound-absorbing film;
   forming an opening that extends through the sound-absorbing film; and
   cutting the mother piezoelectric substance into discrete boundary acoustic wave elements.

* * * * *